(12) United States Patent
Kwon

(10) Patent No.: US 7,335,564 B2
(45) Date of Patent: Feb. 26, 2008

(54) METHOD FOR FORMING DEVICE ISOLATION LAYER OF SEMICONDUCTOR DEVICE

(75) Inventor: Young Min Kwon, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 2 days.

(21) Appl. No.: 11/182,252

(22) Filed: Jul. 14, 2005

(65) Prior Publication Data

US 2006/0014361 A1    Jan. 19, 2006

(30) Foreign Application Priority Data

Jul. 15, 2004    (KR) ...................... 10-2004-0055158

(51) Int. Cl.
*H01L 21/336* (2006.01)
*H01L 21/76* (2006.01)
*H01L 21/302* (2006.01)

(52) U.S. Cl. ...................... 438/296; 438/424; 438/692; 257/E21.546

(58) Field of Classification Search ................ 438/424, 438/296, E21.546, 692; 257/E21.546
See application file for complete search history.

(56) References Cited

U.S. PATENT DOCUMENTS

| | | | | |
|---|---|---|---|---|
| 5,930,644 A | * | 7/1999 | Tsai et al. ................... | 438/424 |
| 6,146,975 A | * | 11/2000 | Kuehne et al. ............. | 438/437 |
| 6,214,691 B1 | * | 4/2001 | Yong et al. ................ | 438/400 |
| 6,258,676 B1 | * | 7/2001 | Lee et al. ................... | 438/296 |
| 6,380,047 B1 | * | 4/2002 | Bandyopadhyay et al. . | 438/427 |
| 6,562,700 B1 | * | 5/2003 | Gu et al. .................... | 438/477 |

* cited by examiner

*Primary Examiner*—Michael Lebentritt
*Assistant Examiner*—Ron Pompey
(74) *Attorney, Agent, or Firm*—Andrew D. Fortney

(57) ABSTRACT

A method for forming a device isolation device of a semiconductor device is disclosed. The method includes the steps of forming a moat pattern for forming a trench on a semiconductor substrate, forming a trench by etching the semiconductor substrate to a predetermined thickness by using the moat pattern, forming a trench isolation layer by depositing a trench filling material on an entire surface of the substrate including the trench by using a high density plasma (HDP) process, partially masking a center region of the substrate and etching the trench isolation layer on edge regions of the substrate to a predetermined thickness, and planarizing the entire surface of the substrate having the trench isolation layer etched. By enhancing the thickness uniformity of the center region and the edge regions of the substrate (or wafer), when forming the trench isolation layer, by using the high density plasma (HDP) process, planarization of the trench isolation layer can be ensured even after the surface planarization process, which can minimize a difference in critical dimension depending upon the position of the center region and edge regions of the gate pattern, which is to be formed in a later process, thereby minimizing differences in device characteristics.

18 Claims, 7 Drawing Sheets

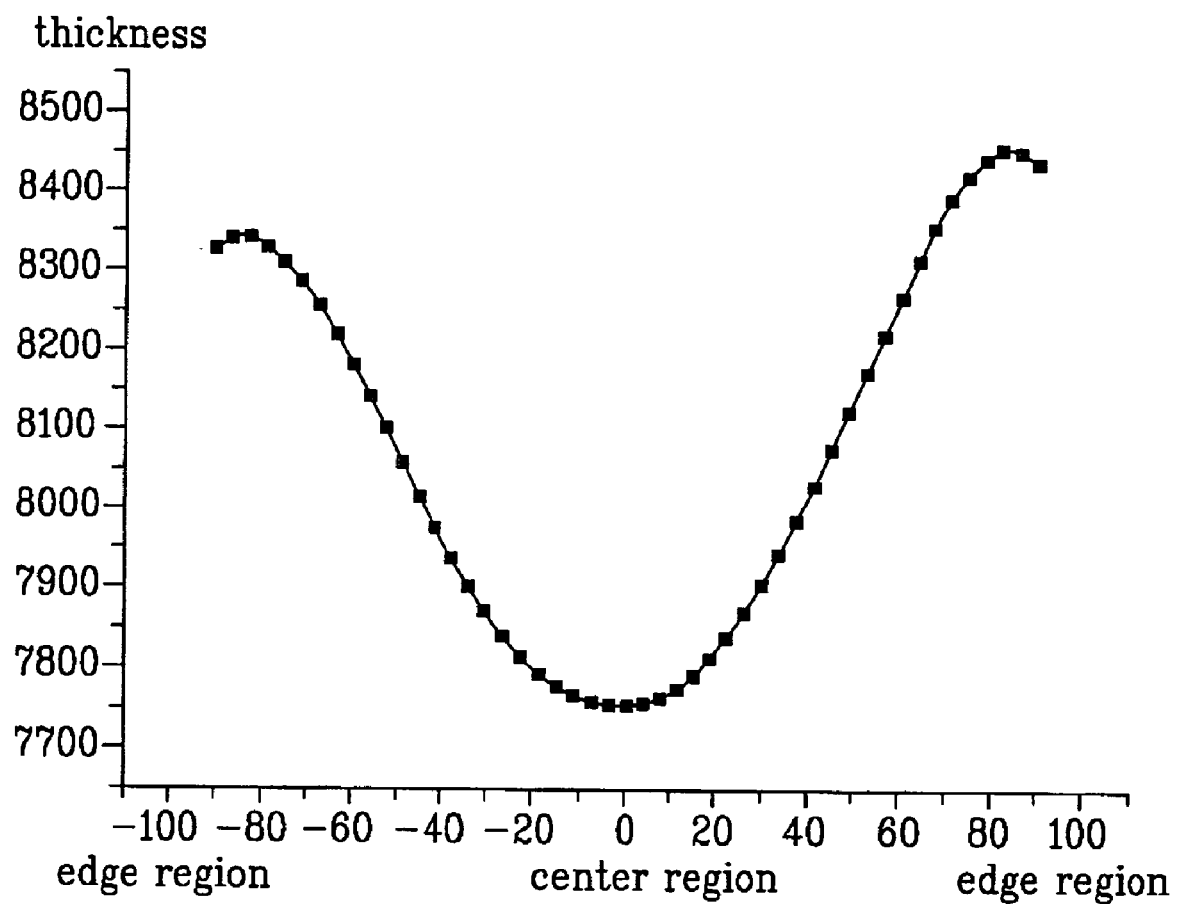

METHOD FOR FORMING DEVICE ISOLATION LAYER OF SEMICONDUCTOR DEVICE

This application claims the benefit of the Patent Korean Application No. P2004-55158 filed on Jul. 15, 2004, which is hereby incorporated by reference as if fully set forth herein.

BACKGROUND OF THE INVENTION

1. Field of the Invention

The present invention relates to a semiconductor device, and more particularly, to a method for forming a device isolation layer of a semiconductor device. Herein, by partially masking a center region of a wafer, when forming a trench isolation layer by using a high density plasma (HDP) process, and by etching edge regions of the wafer, the thickness of the center region and the edge regions of the wafer can become uniform.

2. Discussion of the Related Art

In a semiconductor, a plurality of cells formed in unit devices, such as transistors, capacitors, and so on, are integrated on a limited surface depending on the capacity of the semiconductor device. Due to the individual operation characteristics of each cell, the cells require to be electrically isolated.

Therefore, as a method for electrically isolating each of the cells, LOCal Oxidation of Silicon (LOCOS) and Shallow Trench Isolation (STI) are well known. LOCOS recesses a silicon substrate and develops a field oxidation layer. STI etches a wafer in a vertical direction and fills the trenches formed in the wafer with an isolation material.

STI uses dry-etching methods, such as Reactive Ion Etching (RIE) or plasma etching, to form narrow and deep trenches. Thereafter, the trenches are filled with isolation layers. More specifically, a trench is formed in a silicon wafer, which is then filled with an isolation layer, thereby resolving the problems related to birds beak. In addition, the trench filled with the isolation layer planarizes the surface. Therefore, this method is advantageous in forming fine devices, since the area occupied by the device isolation area is reduced.

As described above, STI is advantageous in ensuring a larger active area for the device. In addition, STI have more enhanced characteristics in the aspect of leakage current caused by connection as compared to LOCOS.

FIG. 1A to FIG. 1D illustrate cross-sectional views showing a process of a related art method for forming a device isolation layer of a semiconductor device.

Referring to FIG. 1A, a pad oxidation layer 13 is formed on a silicon substrate 11, on which a trench for isolating devices is to be formed. Then, a nitride layer 15 is deposited on the pad oxidation layer 13. A photoresist layer 17 is formed by coating a photoresist material, which will be used as an etching mask. The photoresist layer 17 is then patterned, so as to form a photoresist pattern that exposes the area that is to be etched.

Referring to FIG. 1B, the photoresist layer 17 is used as a mask to selectively dry-etch the nitride layer 15 and the pad oxidation layer 13 until the silicon substrate 11 is exposed. Then, the exposed portion of the silicon substrate 11 is dry-etched to a predetermined thickness, so as to form a trench (T).

As shown in FIG. 1C, the photoresist layer 17 is removed and the structure is washed. Subsequently, an STI liner oxidation process is performed. In other words, the surface of the trench (T) is developed by a heating process, thereby forming a liner oxidation layer 19.

Thereafter, a trench filling material is deposited on the entire surface of the structure including the trench (T), so as to form a trench isolation layer 21. The trench isolation layer 21 has usually been deposited by using an Atmospheric Pressure Chemical Vapor Deposition (APCVD) method or a Sub Atmospheric Pressure Chemical Vapor Deposition (SAPCVD) method. Recently, however, as devices have become highly integrated, a high density plasma (HDP) method is being used in order to obtain an excellent gap filling effect.

Referring to FIG. 1D, a Chemical Mechanical Polishing (CMP) process is performed to remove the trench isolation layer 21 remaining on a portion above the nitride layer 15. Thus, the trench isolation layer 21 only exists in the trench (T) area, i.e., the inactive area. After a plurality of processes, such as an ion injection process, and so on, a pre-washing process is performed, so as to develop a gate oxidation layer.

The above-described related method for forming the device isolation layer of the semiconductor device uses the HDP process when forming the trench isolation layer. However, due to the deposition mechanism in the related art method, as deposition and etching processes are performed simultaneously, the HDP process may cause non-uniformity in that the edge regions of the wafer are formed to be thicker than the center region of the wafer, as shown in FIG. 1C. Then, even after performing a planarization process, the edge regions of the wafer may still remain thicker than the center region of the wafer, as shown in FIG. 1D. The deposition profile of the trench isolation layer shown throughout the entire wafer is shown in the graph of FIG. 2.

Therefore, in a later process, due to a step difference in the active area, where the transistor or capacitor is formed, and the field area, which is the device isolation area, a difference in thickness may occur between the center region of the wafer and the edge regions of the wafer, thereby causing a difference in characteristics among the devices.

SUMMARY OF THE INVENTION

Accordingly, the present invention is directed to a method for forming a device isolation layer of a semiconductor device that substantially obviates one or more problems due to limitations and disadvantages of the related art.

An object of the present invention is to provide a method for forming a device isolation layer of a semiconductor device that can enhance uniformity in thickness between a center region and edge regions of a wafer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for forming a device isolation device of a semiconductor device includes the steps of forming a moat pattern for forming a trench on a semiconductor substrate, forming a trench by etching the semiconductor substrate to a predetermined thickness by using the moat pattern, forming a trench isolation layer by depositing a trench filling material on an entire surface of the substrate including the trench by using a high density plasma (HDP) process, partially masking a center region of the substrate and etching the trench isolation layer on edge regions of the substrate to a predetermined thickness, and planarizing the entire surface of the substrate having the trench isolation layer etched.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 2 illustrates a graph showing a deposition profile of the isolation layer on center and edge regions of a wafer caused by forming the related art isolation layer;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIG. 3A to FIG. 3F illustrate cross-sectional views of a process of a method for forming a device isolation layer of a semiconductor device according to the present invention.

Figure 1A:
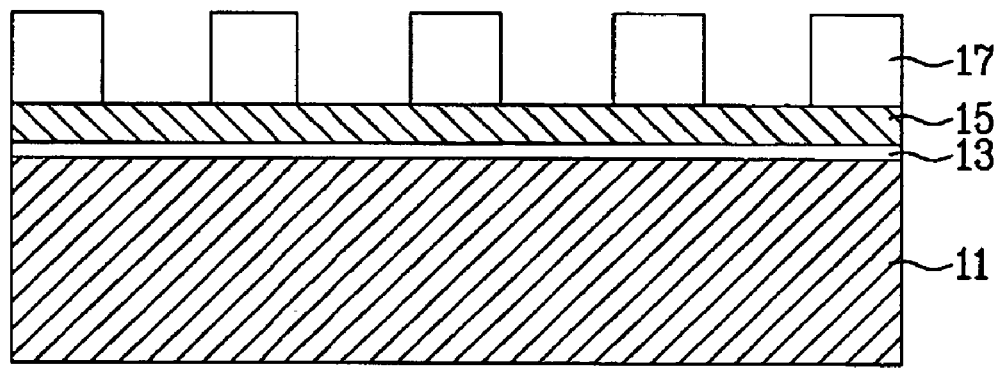
FIG. 1A to FIG. 1D illustrate cross-sectional views showing a process of a related art method for forming a device isolation layer of a semiconductor device.
Figure 1B:
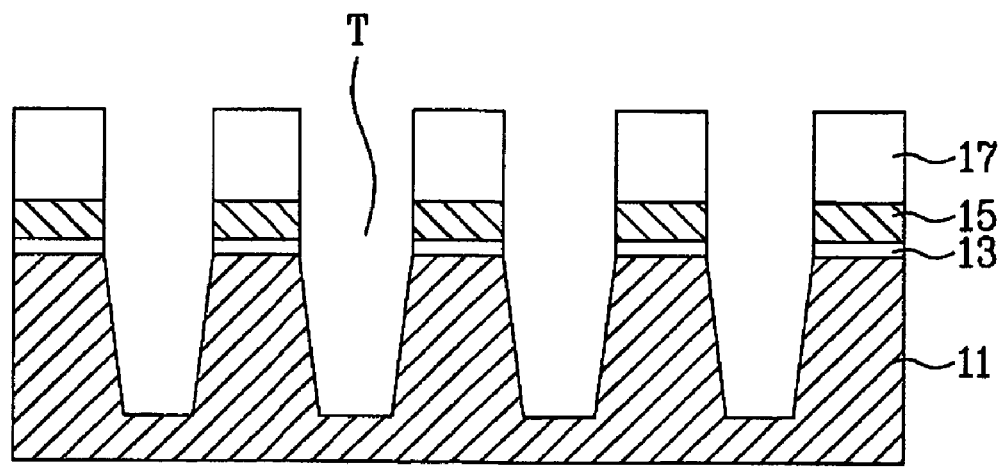
Figure 1C:
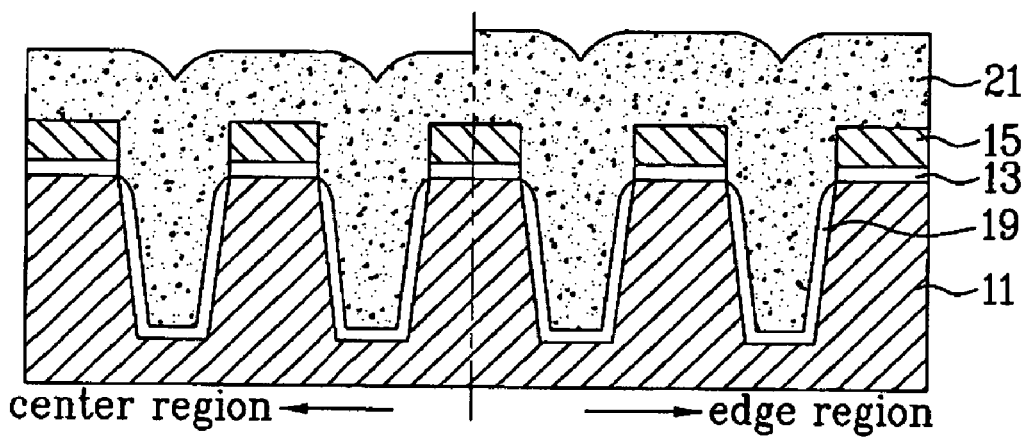
Figure 1D:
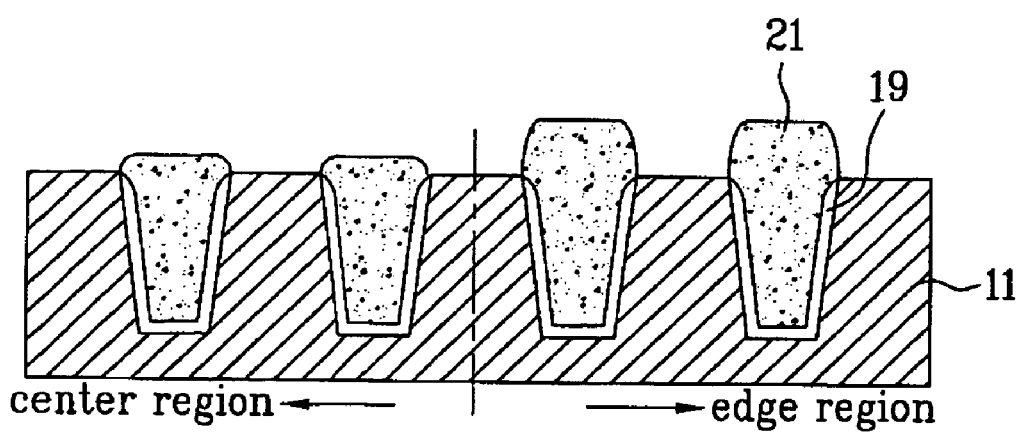
Figure 3A:
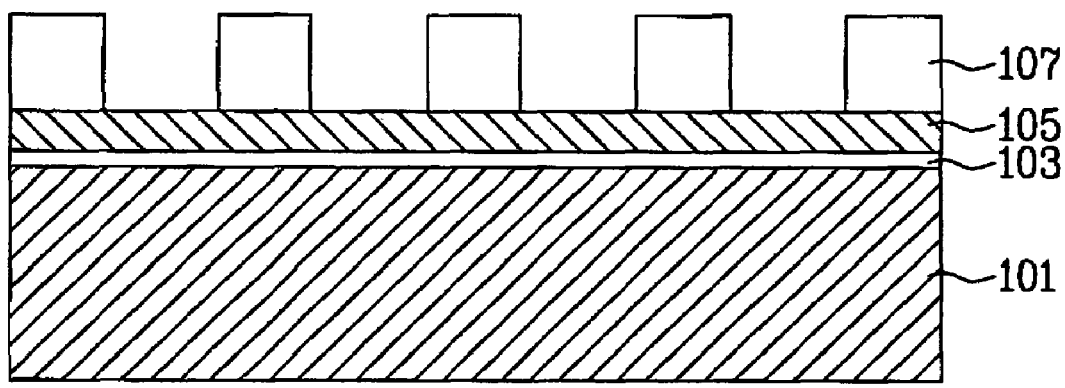
FIG. 3A to FIG. 3F illustrate cross-sectional views of a process of a method for forming a device isolation layer of a semiconductor device according to the present invention.

Referring to FIG. 3A, a pad oxidation layer 103 is formed on a silicon substrate 101, on which a trench for isolating devices is to be formed. Then, a nitride layer 105 is deposited on the pad oxidation layer 103. A first photoresist layer 107 is formed by coating a photoresist material, which will be used as an etching mask. The first photoresist layer 107 is then patterned, so as to form a photoresist pattern that exposes the area that is to be etched. In other words, a moat pattern for forming a trench on the substrate in a later process is formed.

Figure 3B:
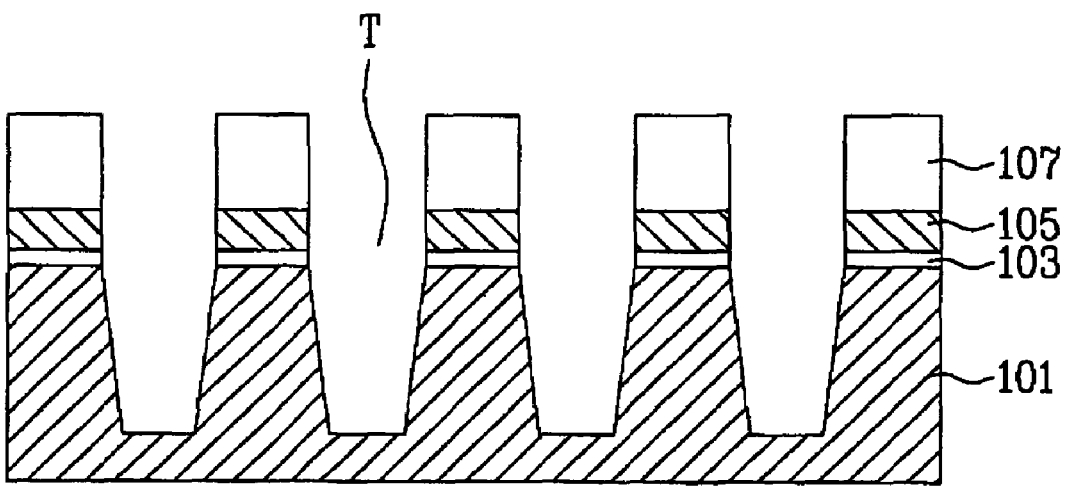

Referring to FIG. 3B, the first photoresist layer 107 is used as a mask to selectively dry-etch the nitride layer 105 and the pad oxidation layer 103 until the silicon substrate 101 is exposed. Then, the exposed portion of the silicon substrate 101 is dry-etched to a predetermined thickness, so as to form a trench (T).

Figure 3C:
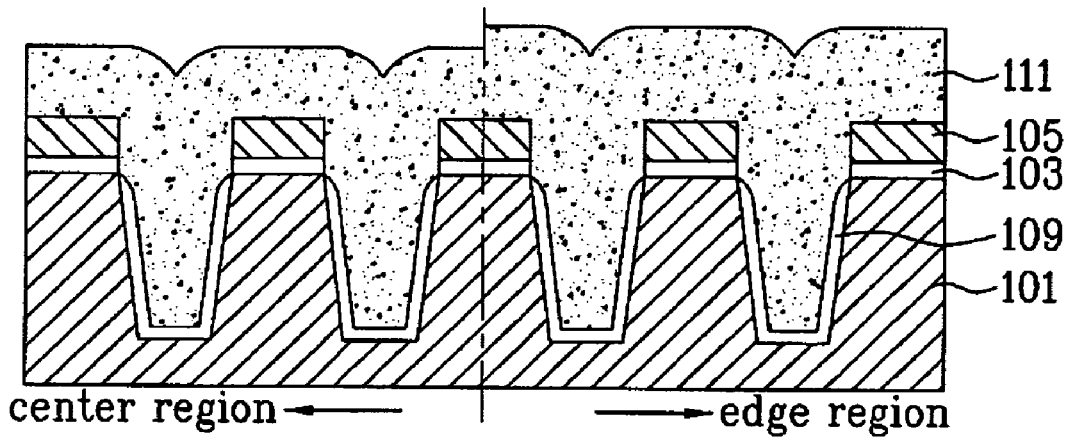

As shown in FIG. 3C, the first photoresist layer 107 is removed and the structure is washed. Subsequently, an STI liner oxidation process is performed. In other words, the surface of the trench (T) is developed by a heating process, thereby forming a liner oxidation layer 109.

Thereafter, a trench filling material is deposited on the entire surface of the structure including the trench (T), so as to form a trench isolation layer 111. The trench isolation layer 111 is formed by using a high density plasma (HDP) method in order to obtain an excellent gap filling effect.

Herein, due to the deposition mechanism, as deposition and etching processes are performed simultaneously, the HDP (As dep.) process may cause non-uniformity in that the trench isolation layer 111 is formed to be thicker on the edge regions of the wafer than on the center region of the wafer, as shown in FIG. 3C.

Figure 3D:
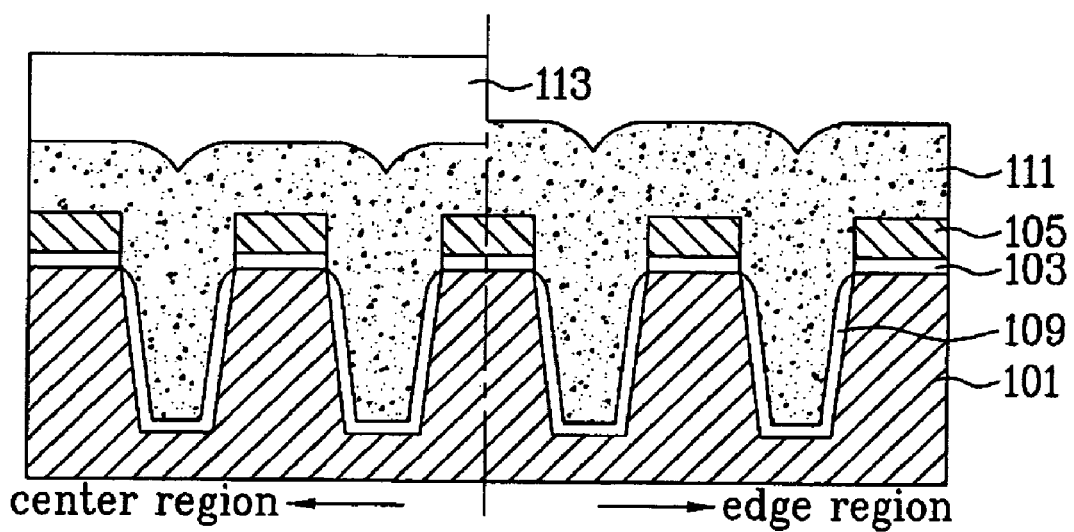

Referring to FIG. 3D, in order to enhance the non-uniformity of the trench isolation layer 111, a second photoresist layer 113 is formed by coating a photoresist material, which will be used as an etching mask. The second photoresist layer 113 is then patterned, so as to form a photoresist pattern that can partially mask the center region of the wafer.

Figure 3E:
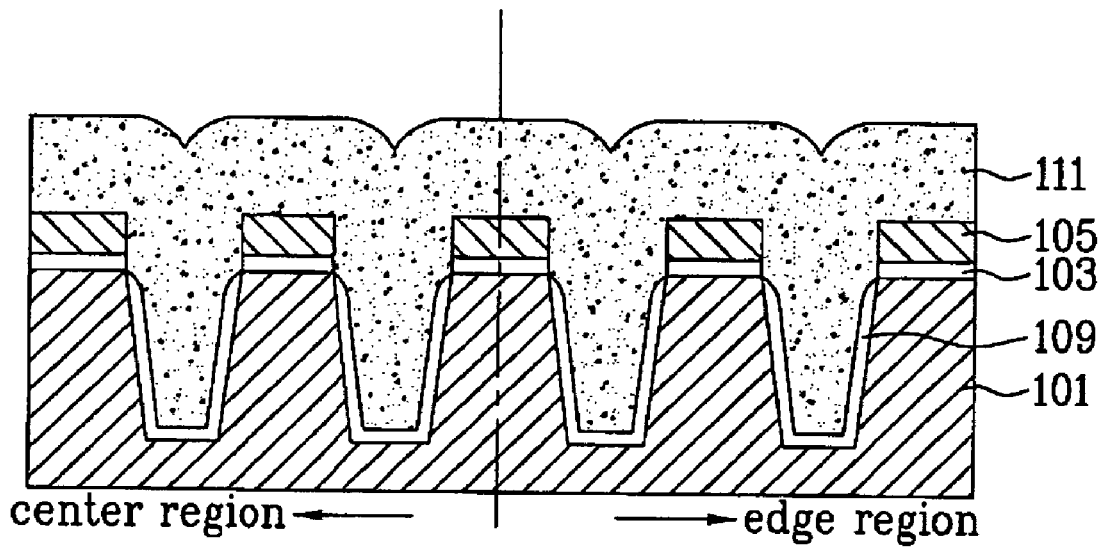

Then, as shown in FIG. 3E, the second photoresist layer 113 is used as a mask to selectively wet-etch the exposed edge region of the trench isolation layer 111 to a predetermined thickness, thereby allowing the trench isolation layer 111 to have a nearly uniform thickness profile on the center region and the edge regions of the wafer. Thereafter, the second photoresist layer 113 is removed.

Figure 3F:
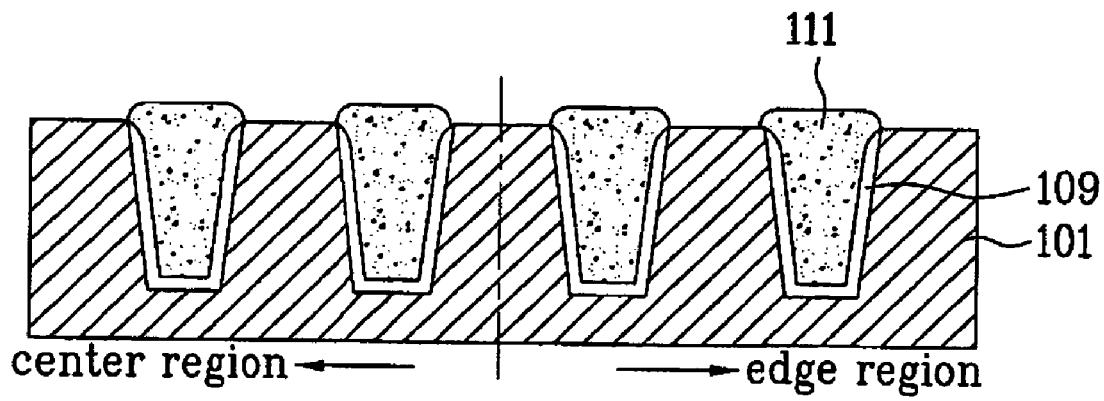

Referring to FIG. 3F, a Chemical Mechanical Polishing (CMP) process is performed to remove the trench isolation layer 111 remaining on a portion above the nitride layer 105. Thus, the trench isolation layer 111 only exists in the trench (T) area, i.e., the inactive area. After a plurality of processes, such as an ion injection process, and so on, a pre-washing process is performed, so as to develop a gate oxidation layer.

Figure 4:
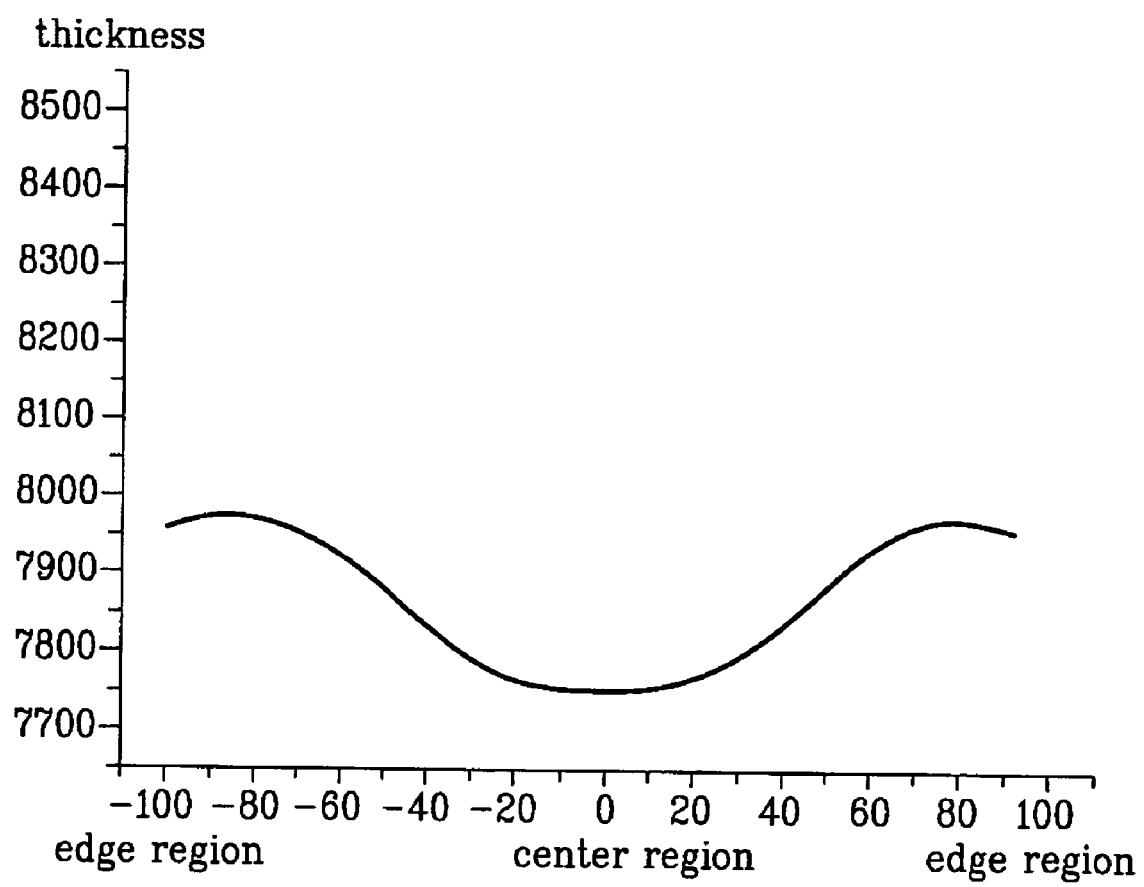
FIG. 4 illustrates a graph showing a deposition profile of the isolation layer on center and edge regions of a wafer caused by forming the isolation layer according to the present invention.

In the present invention, by performing the processes shown in FIG. 3D and FIG. 3E, the uniformity in thickness of the trench isolation layer 111 is enhanced in the center region and edge regions of the wafer. Thus, after performing the surface planarization process, the deposition profile of the trench isolation layer shown throughout the entire wafer can be enhanced as shown in FIG. 4.

The above-described method for forming a device isolation of a semiconductor layer has the following advantages. By partially masking a center region of a wafer, when forming a trench isolation layer by using a high density plasma (HDP) process, and by etching edge regions of the wafer, the thickness of the center region and the edge regions of the wafer can become uniform. Thus, planarization of the trench isolation layer can be ensured even after the surface planarization process, which can minimize a difference in critical dimension depending upon the position of the center region and edge regions of the gate pattern, which is to be formed in a later process, thereby minimizing differences in device characteristics.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for forming a device isolation layer for a semiconductor device, comprising:

forming a moat pattern for forming trenches on a semiconductor wafer;

forming the trenches by etching the semiconductor wafer to a predetermined thickness using the moat pattern as a mask;

depositing a trench filling material on an entire surface of the wafer including the trenches by using a high density plasma (HDP) process;

masking a center region of the wafer including a first plurality of trenches and partially etching the trench filling material on edge regions of the wafer including a second plurality of trenches to a predetermined thickness that is substantially equal to a thickness of the trench filling material in the center region;

planarizing the trench filling material to form a device isolation in the trenches.

2. The method of claim 1, wherein the step of partially etching the trench filling material comprises:

forming a photoresist pattern for masking the center region of the wafer on the trench filling material;

selectively etching the edge portions of the trench filling material to a predetermined thickness using the photoresist pattern as a mask; and removing the photoresist pattern.

3. The method of claim 1, further comprising forming a pad oxide layer on the wafer prior to forming the moat pattern.

4. The method of claim 3, further comprising forming a nitride layer over the pad oxide layer prior to forming the moat pattern.

5. The method of claim 4, wherein forming the trenches comprises dry etching portions of the nitride layer exposed through the moat pattern.

6. The method of claim 5, wherein forming the trenches comprises dry etching portions of the pad oxide layer and portions of the wafer below the etched portions of the nitride layer.

7. The method of claim 1, further comprising removing the moat pattern prior to depositing the trench filling material.

8. The method of claim 7, further comprising washing the wafer after removing the moat pattern.

9. The method of claim 4, wherein forming the moat pattern comprises depositing a photoresist material on the nitride layer and patterning the photoresist material.

10. The method of claim 1, further comprising forming a liner oxide layer on the wafer within the trenches prior to depositing the trenches filling material.

11. The method of claim 10, wherein forming the liner oxide layer comprises thermal oxidation.

12. The method of claim 1, wherein etching the trench filling material comprises a wet etch.

13. The method of claim 1, wherein planarizing the trench filling material comprises a chemical mechanical polishing process.

14. The method of claim 1, wherein planarizing the trench filling material exposes an upper surface of the wafer adjacent to the trenches.

15. The method of claim 1, wherein depositing the trench filling material forms trench isolation layers having a greater thicknesses on the edge region of the wafer than on the center region of the wafer.

16. The method of claim 1, wherein partially etching the trench filling material on the edge region results in the trenches isolation layers having a nearly uniform thickness profile over a surface of the wafer.

17. The method of claim 1, wherein critical dimensions between the trenches in the center region and critical dimensions between the trenches in the edge regions are substantially the same.

18. The method of claim 6, wherein dry etching comprises reactive ion etching (RIE) or plasma etching.

* * * * *